US009048386B2

(12) United States Patent
Teranishi et al.

(10) Patent No.: US 9,048,386 B2
(45) Date of Patent: Jun. 2, 2015

(54) SEMICONDUCTOR LIGHT-EMITTING ELEMENT AND LIGHT-EMITTING DEVICE

(71) Applicant: TOYODA GOSEI CO., LTD., Aichi-ken (JP)

(72) Inventors: Shunsuke Teranishi, Ichihara (JP); Hisao Sato, Ichihara (JP)

(73) Assignee: TOYODA GOSEI CO., LTD., Aichi (JP)

( * ) Notice: Subject to any disclaimer, the term of this patent is extended or adjusted under 35 U.S.C. 154(b) by 0 days.

(21) Appl. No.: 13/911,486

(22) Filed: Jun. 6, 2013

(65) Prior Publication Data
US 2013/0328011 A1 Dec. 12, 2013

(30) Foreign Application Priority Data
Jun. 8, 2012 (JP) ................................. 2012-130847

(51) Int. Cl.
*H01L 33/04* (2010.01)
*H01L 33/06* (2010.01)
*H01L 33/32* (2010.01)
*H01L 33/02* (2010.01)

(52) U.S. Cl.
CPC ................ *H01L 33/32* (2013.01); *H01L 33/04* (2013.01); *H01L 33/02* (2013.01); *H01L 33/06* (2013.01)

(58) Field of Classification Search
None
See application file for complete search history.

(56) References Cited

U.S. PATENT DOCUMENTS

| | | | |
|---|---|---|---|
| 6,744,064 B2 * | 6/2004 | Lee et al. | 257/13 |
| 7,724,795 B2 * | 5/2010 | Son et al. | 372/45.01 |
| 7,923,716 B2 * | 4/2011 | Lee et al. | 257/14 |
| 8,466,449 B2 * | 6/2013 | Lee et al. | 257/14 |
| 2006/0260671 A1 | 11/2006 | Ohta et al. | |
| 2006/0273329 A1 | 12/2006 | Ohta et al. | |

(Continued)

FOREIGN PATENT DOCUMENTS

| | | |
|---|---|---|
| JP | 2009-123717 A | 6/2009 |
| JP | 2011-222812 A | 11/2011 |

(Continued)

OTHER PUBLICATIONS

Rafid A. Abdullah, Kamarulazizi Ibrahim, "Effects of quantum confined stark effect and well thickness on optical properties of double quantum wells violet InGaN laser diodes", Optik—International Journal for Light and Electron Optics, vol. 124, Issue 4, Feb. 2013, pp. 292-296.*

(Continued)

*Primary Examiner* — Joseph Schoenholtz
(74) *Attorney, Agent, or Firm* — Sughrue Mion, PLLC

(57) ABSTRACT

While maintaining unity of wavelength of light emitted from a semiconductor light emitting element, decrease of light emission efficiency with an increase in environmental temperature is suppressed. A semiconductor light-emitting element includes: an n-cladding layer; a light emitting layer laminated on the n-cladding layer; and a p-type semiconductor layer laminated on the light emitting layer. The light emitting layer includes a first barrier layer to an eighth barrier layer and a first well layer to a seventh well layer, and a single well layer is sandwiched by two barrier layers. The first well layer to the fifth well layer have a common standard well thickness and a common composition, and the sixth well layer and the seventh well layer are set at a maximum well thickness larger than the common standard well thickness and have a composition whose band gap energy is larger than that of the common composition.

2 Claims, 6 Drawing Sheets

(56) References Cited

U.S. PATENT DOCUMENTS

| | | | |
|---|---|---|---|
| 2010/0025684 A1 | 2/2010 | Shinohara et al. | |
| 2011/0186815 A1* | 8/2011 | Lee et al. | 257/14 |
| 2011/0187294 A1* | 8/2011 | Bergmann et al. | 315/363 |
| 2011/0198633 A1* | 8/2011 | Tachibana et al. | 257/94 |
| 2011/0227033 A1* | 9/2011 | Kushibe et al. | 257/13 |
| 2011/0248238 A1 | 10/2011 | Yoon et al. | |
| 2012/0241770 A1 | 9/2012 | Na et al. | |
| 2013/0069033 A1* | 3/2013 | Kushibe et al. | 257/13 |
| 2013/0168637 A1* | 7/2013 | Teranishi et al. | 257/13 |
| 2014/0048767 A1* | 2/2014 | Kusunoki et al. | 257/13 |

FOREIGN PATENT DOCUMENTS

| | | |
|---|---|---|
| JP | 2011-223002 A | 11/2011 |
| JP | 2012-204839 A | 10/2012 |

OTHER PUBLICATIONS

Lin, You-Da, Shuichiro Yamamoto, Chia-Yen Huang, Chia-Lin Hsiung, Feng Wu, Kenji Fujito, Hiroaki Ohta, James S. Speck, Steven P. Denbaars, and Shuji Nakamura. "High Quality InGaN/AlGaN Multiple Quantum Wells for Semipolar InGaN Green Laser Diodes." Applied Physics Express 3.8 (2010): 082001.*

Tsai, Chia-Lung, Zhong-Fan Xu, Wei-Jhih Huang, and Chih-Ta Yen. "Effects of an Asymmetric Barrier Layer on the Structural and Optical Properties of InGaN LEDs." Journal of the Electrochemical Society 159.5 (2012): H473.*

Communication dated Nov. 4, 2014 from The United States Patent Office in related U.S. Appl. No. 13/722,042 (published as US 2013/0168637).

* cited by examiner

SEMICONDUCTOR LIGHT-EMITTING ELEMENT AND LIGHT-EMITTING DEVICE

CROSS REFERENCE TO RELATED APPLICATIONS

This application is based on and claims priority under 35 USC §119 from Japanese Patent Application No. 2012-130847 filed Jun. 8, 2012.

BACKGROUND

1. Technical Field

The present invention relates to a semiconductor light-emitting element using a group III nitride semiconductor and a light-emitting device using a semiconductor light emitting element.

2. Related Art

In general, a semiconductor light emitting element using a group III nitride semiconductor is formed by arranging a light emitting layer using the group III nitride semiconductor between an n-type of group III nitride semiconductor layer containing n-type impurities for generating electrons as a carrier and a p-type of group III nitride semiconductor layer containing p-type impurities for generating holes as a carrier. In a semiconductor light emitting element in this type, it is known that the light emitting layer is configured with a multiple quantum well structure in which plural well layers and plural barrier layers are alternately laminated (refer to Japanese Patent Application Laid-Open Publication No. 2011-222812).

However, even in the semiconductor light emitting element using the group III nitride semiconductor provided with the light emitting layer having the multiple quantum well structure, in a case where there are many electrons or holes that cannot recombine in plural well layers in the light emitting layer, light emission efficiency in the semiconductor light emitting element is sometimes decreased.

In addition, when an environmental temperature of a place where the semiconductor light emitting element is provided is increased, with an increase in the ratio of non-emitting combination in recombination, there are some cases where the light emission efficiency in the semiconductor light emitting element is further decreased. In particular, under the conditions of high current density, the light emission efficiency is significantly decreased.

It is an object of the present invention to suppress decrease of the light emission efficiency with an increase in the environmental temperature while maintaining unity of the wavelength of light emitted from a semiconductor light emitting element.

SUMMARY

According to an aspect of the present invention, there is provided a semiconductor light-emitting element including: an n-type semiconductor layer that is composed of a group III nitride semiconductor containing an n-type impurity; a light emitting layer that is laminated on the n-type semiconductor layer and composed of a group III nitride semiconductor, the light emitting layer emitting light by passing a current; and a p-type semiconductor layer that is laminated on the light emitting layer and composed of a group III nitride semiconductor containing a p-type impurity. The light emitting layer includes: at least four well layers that are composed of a group III nitride semiconductor; and at least five barrier layers that are composed of a group III nitride semiconductor whose band gap is larger than a band gap of the group III nitride semiconductor of the well layers. The barrier layers sandwich each of the at least four well layers from both sides, is connected to the n-type semiconductor layer at an interface portion with the n-type semiconductor layer and is connected to the p-type semiconductor layer at an interface portion with the p-type semiconductor layer. The at least four well layers include: plural n-side well layers that are provided in order from a side near the n-type semiconductor layer, each of which is set to have a first thickness to output light of a common wavelength; and plural p-side well layers that are provided in order from a side near the p-type semiconductor layer to the plural n-side well layers, each of which is set to have a thickness larger than the first thickness and have a composition different from a composition of the plural n-side well layers to output light of the common wavelength.

In such a semiconductor light-emitting element, of the at least four well layers, the number of the p-side well layers is two.

Moreover, each of the two p-side well layers is set to have a second thickness that is larger than the first thickness, and the two p-side well layers have a common composition.

Further, of the at least five barrier layers, thickness of a p-side barrier layer nearest the p-type semiconductor layer is larger than thicknesses of the other barrier layers.

Still further, each of the at least five barrier layers is composed of GaN and each of the at least four well layers is composed of GaInN, and a density of In in the p-side well layer of the well layer is lower than a density of In in the n-side well layer of the well layer.

Moreover, according to an aspect of the present invention, there is provided a light-emitting device including: a base section in which a first wiring and a second wiring are formed; and a semiconductor light emitting element that emits light by passing a current via the first wiring and the second wiring, the semiconductor light emitting element including: an n-type semiconductor layer that is composed of a group III nitride semiconductor containing an n-type impurity; a light emitting layer that is laminated on the n-type semiconductor layer and composed of a group III nitride semiconductor, the light emitting layer emitting light by passing a current; a p-type semiconductor layer that is laminated on the light emitting layer and composed of a group III nitride semiconductor containing a p-type impurity; a p-side electrode for electrically connecting the p-type semiconductor layer and the first wiring; and an n-side electrode for electrically connecting the n-type semiconductor layer and the second wiring. The light emitting layer includes: at least four well layers that are composed of a group III nitride semiconductor; and at least five barrier layers that are composed of a group III nitride semiconductor whose band gap is larger than a band gap of the group III nitride semiconductor of the well layers. The barrier layers sandwich each of the at least four well layers from both sides, is connected to the n-type semiconductor layer at an interface portion with the n-type semiconductor layer and is connected to the p-type semiconductor layer at an interface portion with the p-type semiconductor layer. The at least four well layers include: plural n-side well layers that are provided in order from a side near the n-type semiconductor layer, each of which is set to have a first thickness to output light of a common wavelength; and plural p-side well layers that are provided in order from a side near the p-type semiconductor layer to the plural n-side well layers, each of which is set to have a thickness larger than the first thickness and have a composition different from a composition of the plural n-side well layers to output light of the common wavelength.

According to the present invention, it is possible to suppress decrease of the light emission efficiency with an increase in the environmental temperature while maintaining unity of the wavelength of light emitted from a semiconductor light emitting element.

BRIEF DESCRIPTION OF THE DRAWINGS

An exemplary embodiment of the present invention will be described in detail based on the following figures, wherein.

DETAILED DESCRIPTION

Figure 1:
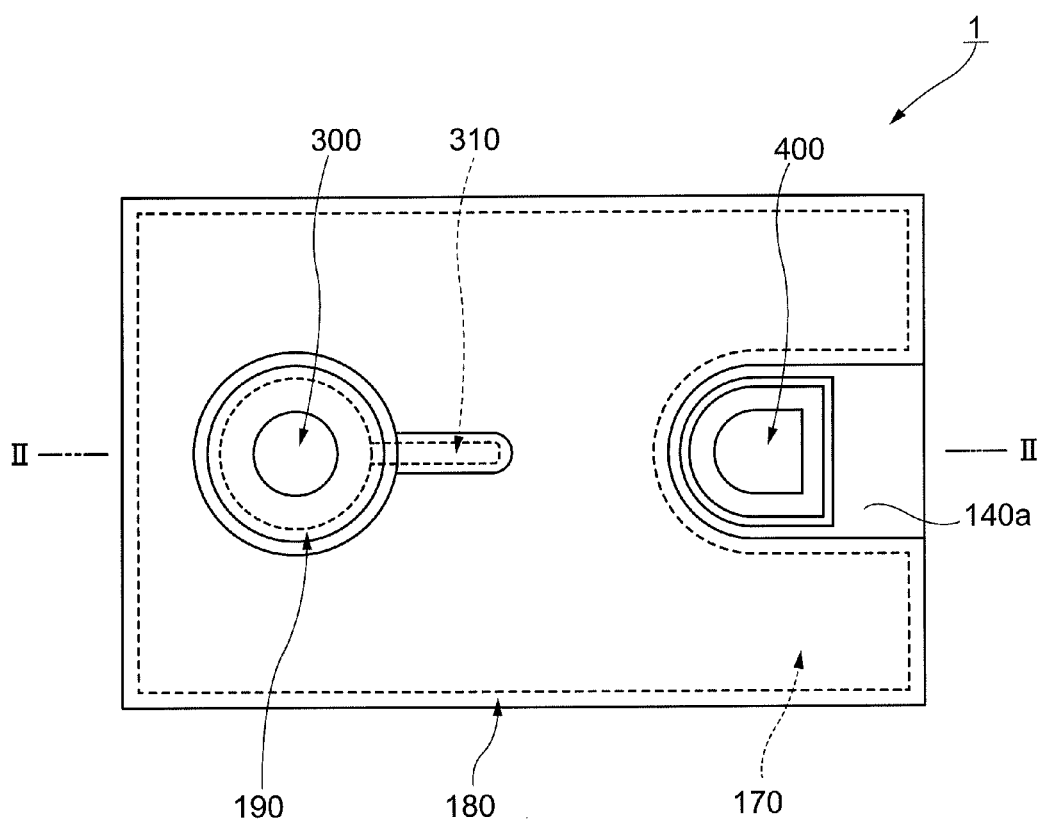
FIG. 1 is a specific example of a top view showing a semiconductor light emitting element to which an exemplary embodiment is applied.

Hereinafter, an exemplary embodiment according to the present invention will be described in detail with reference to accompanying drawings. It should be noted that there are some cases where a size or a thickness of each component in the drawings that are referred to in the following description is different from a dimension of an actual semiconductor light emitting element and the like.

Figure 2:
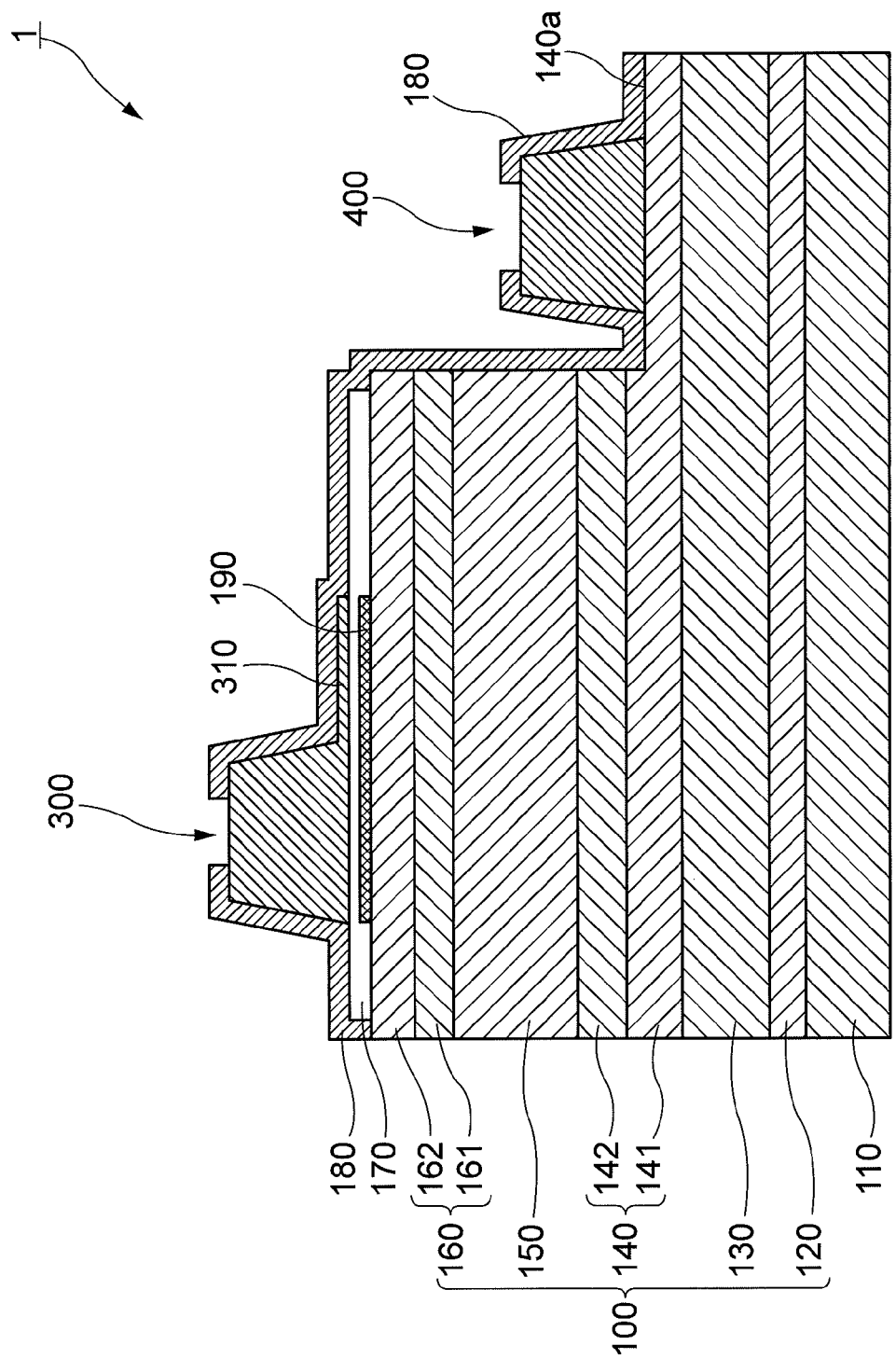
FIG. 2 is a II-II cross-sectional view in FIG. 1.

FIG. 1 is a specific example of a top view showing a semiconductor light emitting element (a light emitting diode) 1 to which the exemplary embodiment is applied, and FIG. 2 is a II-II cross sectional view of the semiconductor light emitting element 1 shown in FIG. 1.

(Semiconductor Light Emitting Element)

The semiconductor light emitting element 1 includes: a substrate 110; an intermediate layer 120 laminated on the substrate 110; and a base layer 130 laminated on the intermediate layer 120. The semiconductor light emitting element 1 also includes: an n-type semiconductor layer 140 laminated on the base layer 130; a light emitting layer 150 laminated on the n-type semiconductor layer 140; and a p-type semiconductor layer 160 laminated on the light emitting layer 150. Here, the n-type semiconductor layer 140 includes an n-contact layer 141 laminated on the base layer 130 and an n-cladding layer 142, which is laminated on the n-contact layer 141 and on which the light emitting layer 150 is laminated. On the other hand, the p-type semiconductor layer 160 includes a p-cladding layer 161 laminated on the light emitting layer 150 and a p-contact layer 162 laminated on the p-cladding layer 161. It should be noted that, in the following description, these intermediate layer 120, base layer 130, n-type semiconductor layer 140, light emitting layer 150 and p-type semiconductor layer 160 will be collectively referred to as a laminated semiconductor layer 100 in some cases as necessary.

Further, the semiconductor light emitting element 1 includes a transparent conductive layer 170 laminated on the p-type semiconductor layer 160 (more specifically, on the p-contact layer 162), a p-side electrode 300 laminated on part of the transparent conductive layer 170 and a transparent insulating layer 190 arranged between the p-type semiconductor layer 160 and the transparent conductive layer 170. Here, the p-side electrode 300 includes an extending portion 310 that is formed linearly from an end portion thereof along a top surface of the transparent conductive layer 170. In addition, the transparent insulating layer 190 is arranged at a position beneath the p-side electrode 300 including the extending portion 310 in the cross-sectional view shown in FIG. 2.

Still further, the semiconductor light emitting element 1 includes an n-side electrode 400 laminated on part of a semiconductor layer exposure surface 140a of the n-type semiconductor layer 140, which is exposed by cutting out part of each of the p-type semiconductor layer 160, light emitting layer 150 and n-type semiconductor layer 140 of the laminated semiconductor layer 100. It should be noted that, in the semiconductor layer exposure surface 140a, the n-contact layer 141 in the n-type semiconductor layer 140 is exposed.

The semiconductor light emitting element 1 further includes a protecting layer 180 laminated to cover a region of the transparent conductive layer 170 on which the p-side electrode 300 is not attached, a region of the p-electrode except for a part, a region of the semiconductor layer exposure surface 140a on which the n-side electrode 400 is not attached, and a region of the n-side electrode 400 except for a part. It should be noted that the protecting layer 180 also covers wall surfaces of the n-type semiconductor layer 140, the light emitting layer 150 and the p-type semiconductor layer 160 that have been exposed by cutting out a part of each of the p-type semiconductor layer 160, the light emitting layer 150 and the n-type semiconductor layer 140.

In the semiconductor light emitting element 1, the light emitting layer 150 is configured to emit light by setting the p-side electrode 300 as a positive electrode and the n-side electrode 400 as a negative electrode to pass a current from the p-side electrode 300 to the n-side electrode 400.

It should be noted that the semiconductor light emitting element 1 is a light emitting diode of the face-up type in which light outputted from the light emitting layer 150 is extracted from the side on which the p-side electrode 300 and the n-side electrode 400 are formed.

Next, each component of the semiconductor light emitting element 1 will be described in more detail.

Figure 3:
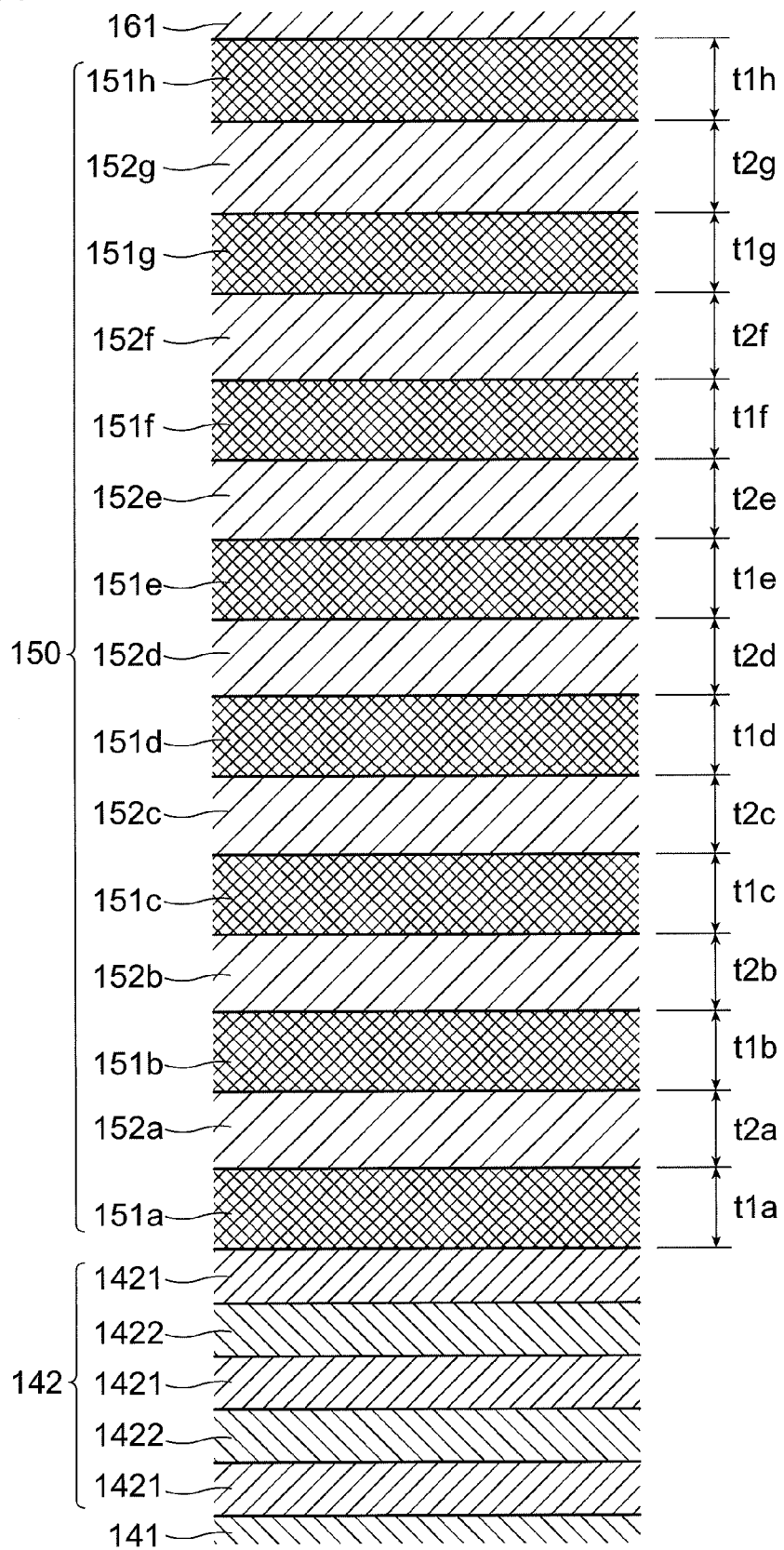
FIG. 3 is an enlarged cross-sectional view of a light emitting layer and a periphery thereof in the semiconductor light emitting element.

Here, FIG. 3 is an enlarged cross-sectional view of the light emitting layer 150 and a periphery thereof in the semiconductor light emitting element 1. In the following description, the configuration of the semiconductor light emitting element 1 will be described with reference to FIG. 3 in addition to FIGS. 1 and 2.

It should be noted that, in the following description, AlGaN, GaN and GaInN as specific examples of a group III nitride semiconductor are described with the compositional ratio of each element being omitted in some cases.

<Substrate>

The substrate 110 can be selected to be used from various kinds of substrates without any limitation. For example, a substrate 110 composed of sapphire, silicon carbide, silicon, zinc oxide or the like can be used.

Moreover, among the above-described substrate materials, it is particularly preferable to use the sapphire substrate whose C-plane is a principal plane. In the case where the sapphire substrate is used as the substrate 110, the intermediate layer 120 (the buffer layer) may be formed on the C-plane of the sapphire.

Further, as the substrate 110 used in the present invention, a processed substrate described in Japanese Patent Application Laid-Open Publication No. 2009-123717 (plural convex portions not parallel to a C-plane of a sapphire single crystal are formed on the C-plane, thereby forming a surface of a substrate) can be preferably applied.

<Laminated Semiconductor Layer>

The laminated semiconductor layer 100 is composed of, for example, a group III nitride semiconductor, which is configured by laminating the intermediate layer 120, the base layer 130, the n-type semiconductor layer 140, the light emitting layer 150 and the p-type semiconductor layer 160 on the substrate 110 in this order as shown in FIG. 1. Here, in the n-type semiconductor layer 140, an electron is a carrier, while in the p-type semiconductor layer 160, a hole is a carrier.

Hereinafter, each of the layers constituting the laminated semiconductor layer 100 will be described in order.

[Intermediate Layer]

The intermediate layer 120 has a function of mediating the difference in lattice constant between the substrate 110 and the base layer 130, and especially in the case where the substrate 110 is composed of a sapphire whose C-plane is a principal plane, serves to facilitate the formation of a single crystal layer which is C-axis oriented on the (0001) plane (the C-plane) of the substrate 110. Consequently, if a single crystal base layer 130 is laminated on the intermediate layer 120, the base layer 130 having more excellent crystallinity can be laminated. It should be noted that formation of the intermediate layer 120 is preferably carried out in the present invention, but not necessarily needed.

The intermediate layer 120 is preferably composed of polycrystal $Al_xGa_{1-x}N$ (0≤x≤1), and more preferably, composed of single crystal $Al_xGa_{1-x}N$ (0≤x≤1).

The intermediate layer 120 can be composed of, for example, polycrystal $Al_xGa_{1-x}N$ (0≤x≤1) with a thickness of 10 nm to 500 nm. If the thickness of the intermediate layer 120 is less than 10 nm, there are some cases where an effect of the intermediate layer 120 to mediate the difference in lattice constant between the substrate 110 and the base layer 130 cannot be sufficiently obtained. On the other hand, if the thickness of the intermediate layer 120 is more than 500 nm, there is a possibility that the time of forming process of the intermediate layer 120 becomes longer though there is no change to the function of the intermediate layer 120, and accordingly the productivity is decreased.

Further, the intermediate layer 120 may have a crystal structure of a hexagonal system composed of the group III nitride semiconductor. The crystal of the group III nitride semiconductor constituting the intermediate layer 120 may be a crystal having a single crystal structure, and the crystal having a single crystal structure is preferably used. Crystals of the group III nitride semiconductor grow not only in an upper direction but also in an in-plane direction to form a single crystal structure by controlling growing conditions. Accordingly, the intermediate layer 120 can be composed of the group III nitride semiconductor crystals having single crystal structure by controlling layer forming conditions of the intermediate layer 120. In the case where the intermediate layer 120 having such a single crystal structure is formed on the substrate 110, the buffer function of the intermediate layer 120 effectively works, and thereby the group III nitride semiconductor formed thereon becomes a crystal film having excellent orientation property and crystallinity.

Furthermore, it is possible to provide the group III nitride semiconductor crystals constituting the intermediate layer 120 as columnar crystals (polycrystals) composed of an aggregate structure based on hexagonal columns by controlling layer forming conditions. It should be noted that the columnar crystals composed of an aggregate structure described here refers to crystals which are separated from adjacent crystal grains by crystal grain boundaries formed therebetween, and are columnar by themselves in a longitudinal sectional shape.

It should be noted that the intermediate layer 120 with excellent crystallinity can be obtained by forming by an MOCVD method; however, a sputtering method under optimized conditions can form a semiconductor layer having more excellent crystallinity than that formed by the MOCVD method.

[Base Layer]

As the base layer 130, $Al_xGa_yIn_zN$ (0≤x≤1, 0≤y≤1, 0≤z≤1, x+y+z=1) can be used, but it is preferable to use $Al_xGa_{1-x}N$ (0≤x<1) because the base layer 130 with excellent crystallinity can be formed.

The thickness of the base layer 130 is preferably 100 nm or more, more preferably 500 nm or more, and most preferably 1000 nm (1 μm) or more. The $Al_xGa_{1-x}N$ layer having excellent crystallinity is likely to be obtained with these layer thickness or more.

To improve the crystallinity of the base layer 130, it is desirable that the base layer 130 is not doped with impurities. However, if conductivity of p-type or n-type is needed for the base layer 130, acceptor impurities (p-type impurities) or donor impurities (n-type impurities) can be added.

[N-Type Semiconductor Layer]

The n-type semiconductor layer 140, in which electrons are the carrier, includes the n-contact layer 141 laminated on the base layer 130 and the n-cladding layer 142, which is laminated on the n-contact layer 141 and on which the light emitting layer 150 is laminated as described above. It should be noted that the above-described base layer 130 may be included in the n-type semiconductor layer 140.

The n-contact layer 141 is a layer for providing the n-side electrode 400. The n-contact layer 141 is preferably configured with the $Al_xGa_{1-x}N$ layer (0≤x<1, more preferably 0≤x≤0.5, and still more preferably 0≤x≤0.1).

Moreover, the n-contact layer 141 is preferably doped with n-type impurities, and it is preferable to contain the n-type impurities having a concentration of $1\times10^{17}/cm^3$ to $1\times10^{20}/cm^3$, and a concentration of $1\times10^{18}/cm^3$ to $1\times10^{19}/cm^3$ is more preferable on the point that a good ohmic contact with the n-side electrode 400 can be maintained. As the n-type impurities, though not particularly limited, Si, Ge, Sn and so on are provided, and Si and Ge are preferably provided.

The thickness of the n-contact layer 141 is preferably set to 500 nm to 5000 nm (5 μm), and more preferably set in a range of 1000 nm (1 μm) to 4000 nm (4 μm). If the thickness of the n-contact layer 141 is in the above-described ranges, crystallinity of the group III nitride semiconductor is suitably maintained.

The n-cladding layer 142 performs injection of the carriers (the electrons here) into the light emitting layer 150 and confinement of the carriers, and in the exemplary embodiment, the n-cladding layer 142 is configured as a layer containing a superlattice structure.

To be described more specifically, the n-cladding layer 142 contains, for example, as shown in FIG. 3, a structure in which an n-first cladding layer 1421 composed of the group III nitride semiconductor with a thickness of 10 nm or less and an n-second cladding layer 1422 composed of the group III nitride semiconductor having a composition different from that of the n-side first layer and having a thickness of 10 nm or less are alternately laminated. The n-cladding layer 142 has a structure that sandwiches a single n-second cladding layer 1422 by two n-first cladding layers 1421, and each of the side in contact with the n-contact layer 141 and the side in contact with the light emitting layer 150 is the n-first cladding layer 1421. It should be noted that, in this specific example, the thickness of each of the n-first cladding layer 1421 and the n-second cladding layer 1422 is set at 2 nm.

Here, FIG. 3 exemplifies a case where the n-cladding layer 142 is configured with five layers including three n-first cladding layers 1421 and two n-second cladding layers 1422. However, this is merely a specific example, and the n-cladding layer 142 can be configured with twenty-one layers including eleven n-first cladding layers 1421 and ten n-second cladding layers 1422, for instance.

Moreover, in the exemplary embodiment, the n-first cladding layer 1421 and the n-second cladding layer 1422 are configured with GaInN and GaN, respectively. In the case where the n-cladding layer 142 containing GaInN is formed, it is desirable that the band gap of GaInN constituting the n-first cladding layer 1421 is larger than that of GaInN of the light emitting layer 150. The In composition in GaInN constituting the n-first cladding layer 1421 is desirably in the range of 0.5 atomic % to 3.0 atomic %. Instead of the above-described configuration, the n-first cladding layer 1421 and the n-second cladding layer 1422 may be configured with AlGaN and GaN, respectively.

The thickness of the n-cladding layer 142 in total is not particularly limited, but preferably in the range of 5 nm to 500 nm, and more preferably in the range of 5 nm to 100 nm. The n-type impurity concentration of the n-cladding layer 142 is preferably in the range of $1.5 \times 10^{17}/cm^3$ to $1.5 \times 10^{20}/cm^3$, and more preferably in the range of $1.5 \times 10^{18}/cm^3$ to $1.5 \times 10^{19}/cm^3$. It is preferable to provide the impurity concentration in these ranges in terms of maintaining excellent crystallinity and reducing operation voltage of the semiconductor light emitting element 1.

[Light Emitting Layer]

The light emitting layer 150 of the exemplary embodiment has a so-called multiple quantum well structure in which barrier layers and well layers are alternately laminated. To be described more specifically, as shown in FIG. 3, the light emitting layer 150 includes: a first barrier layer 151a laminated on the n-cladding layer 142 (the n-first cladding layer 1421); a first well layer 152a laminated on the first barrier layer 151a; a second barrier layer 151b laminated on the first well layer 152a; a second well layer 152b laminated on the second barrier layer 151b; a third barrier layer 151c laminated on the second well layer 152b; a third well layer 152c laminated on the third barrier layer 151c; a fourth barrier layer 151d laminated on the third well layer 152c; a fourth well layer 152d laminated on the fourth barrier layer 151d; a fifth barrier layer 151e laminated on the fourth well layer 152d; a fifth well layer 152e laminated on the fifth barrier layer 151e; a sixth barrier layer 151f laminated on the fifth well layer 152e; a sixth well layer 152f laminated on the sixth barrier layer 151f; a seventh barrier layer 151g laminated on the sixth well layer 152f; a seventh well layer 152g laminated on the seventh barrier layer 151g; and an eighth barrier layer 151h laminated on the seventh well layer 152g, on which the p-cladding layer 161 is laminated.

In this manner, the light emitting layer 150 of the exemplary embodiment is configured with 15 layers including 8 barrier layers (the first barrier layer 151a to the eighth barrier layer 151h) and 7 well layers (the first well layer 152a to the seventh well layer 152g). Moreover, the light emitting layer 150 has a structure in which a single well layer is sandwiched by two barrier layers. Then, in the light emitting layer 150, on a side in contact with the n-type semiconductor layer 140 (the n-cladding layer 142), the first barrier layer 151a is positioned, and on a side in contact with the p-type semiconductor layer 160 (the p-cladding layer 161), the eighth barrier layer 151h is positioned.

It should be noted that, in the following description, in the light emitting layer 150, the first barrier layer 151a, the second barrier layer 151b, the third barrier layer 151c, the fourth barrier layer 151d, the fifth barrier layer 151e, the sixth barrier layer 151f, the seventh barrier layer 151g and the eighth barrier layer 151h are collectively referred to as a barrier layer 151 in some cases. Moreover, of the first barrier layer 151a to the eighth barrier layer 151h constituting the barrier layer 151, the layer nearest the p-type semiconductor layer 160 (in this specific example, the eighth barrier layer 151h) is sometimes referred to as "final barrier layer".

On the other hand, in the following description, in the light emitting layer 150, the first well layer 152a, the second well layer 152b, the third well layer 152c, the fourth well layer 152d, the fifth well layer 152e, the sixth well layer 152f and the seventh well layer 152g are collectively referred to as a well layer 152 in some cases. Moreover, of the first well layer 152a to the seventh well layer 152g constituting the well layer 152, the layer nearest the p-type semiconductor layer 160 (in this specific example, the seventh well layer 152g) is sometimes referred to as "final well layer", and the layer next nearest the p-type semiconductor layer 160 (in this specific example, the sixth well layer 152f) is sometimes referred to as "quasi-final well layer".

Then, first, description will be given of a relationship between the thickness of each layer constituting the barrier layer 151 and the thickness between the layers.

In the barrier layer 151, the thicknesses of the first barrier layer 151a, the second barrier layer 151b, the third barrier layer 151c, the fourth barrier layer 151d, the fifth barrier layer 151e, the sixth barrier layer 151f, the seventh barrier layer 151g and the eighth barrier layer 151h are assumed to be a first barrier thickness t1a, a second barrier thickness t1b, a third barrier thickness t1c, a fourth barrier thickness t1d, a fifth barrier thickness t1e, a sixth barrier thickness t1f, a seventh barrier thickness t1g and an eighth barrier thickness t1h, respectively. In this specific example, of the first barrier layer 151a to the eighth barrier layer 151h, the first barrier layer 151a positioned at a side nearest the n-type semiconductor layer 140 and the second barrier layer 151b to the seventh barrier layer 151g subsequent to the first barrier layer 151a are set to have a common thickness (hereinafter, referred to as a standard barrier thickness t1std: t1a=t1b=t1c=t1d=t1e=t1f=t1g=t1std). On the other hand, of the first barrier layer 151a to the eighth barrier layer 151h, the eighth barrier layer 151h positioned at a side nearest the p-type semiconductor layer 160 is set to have a thickness larger than the standard barrier thickness t1std (hereinafter, referred to as a maximum barrier thickness t1max: t1std<t1h=t1max).

It should be noted that, in this specific example, the standard barrier thickness t1std and the maximum barrier thickness t1max are set at 2.5 nm and 4.0 nm, respectively. Accordingly, a total barrier thickness t1 (=t1a+t1b+t1c+t1d+t1e+t1f+t1g+t1h), which is a thickness of the entire barrier layer 151, is 21.5 nm.

Moreover, in the following description, of the first barrier layer 151a to the eighth barrier layer 151h constituting the barrier layer 151, the layer whose thickness is set at the standard barrier thickness t1std (in this specific example, the first barrier layer 151a to the seventh barrier layer 151g) is sometimes referred to as "standard thickness barrier layer". Further, of the first barrier layer 151a to the eighth barrier layer 151h constituting the barrier layer 151, the layer whose thickness is set at the maximum barrier thickness t1max (in this specific example, the eighth barrier layer 151h) is sometimes referred to as "maximum thickness barrier layer".

Subsequently, description will be given of a relationship between the thickness of each layer constituting the well layer 152 and the thickness between the layers.

In the well layer 152, the thicknesses of the first well layer 152a, the second well layer 152b, the third well layer 152c, the fourth well layer 152d, the fifth well layer 152e, the sixth well layer 152f and the seventh well layer 152g are assumed to be a first well thickness t2a, a second well thickness t2b, a third well thickness t2c, a fourth well thickness t2d, a fifth well thickness t2e, a sixth well thickness t2f and a seventh well thickness t2g, respectively. In this specific example, of the first well layer 152a to the seventh well layer 152g, the first well layer 152a positioned at a side nearest the n-type semiconductor layer 140 and the second well layer 152b to the fifth well layer 152e subsequent to the first well layer 152a are set to have a common thickness (hereinafter, referred to as a standard well thickness t2std: t2a=t2b=t2c=t2d=t2e=t2std). On the other hand, of the first well layer 152a to the seventh well layer 152g, the seventh well layer 152g positioned at a side nearest the p-type semiconductor layer 160 and the sixth well layer 152f subsequent thereto are set to have a thickness larger than the standard well thickness t2std (hereinafter, referred to as a maximum well thickness t2max). Particularly, in this specific example, the sixth well thickness t2f of the sixth well layer 152f and the seventh well thickness t2g of the seventh well layer 152g are the same (t2std<t2f=t2g=t2max).

It should be noted that, in this specific example, the standard well thickness t2std and the maximum well thickness t2max are set at 3.5 nm and 4.1 nm, respectively. Accordingly, a total well thickness t2 (=t2a+t2b+t2c+t2d+t2e+t2f+t2g), which is a thickness of the entire well layer 152, is 25.7 nm. Further, in this specific example, the standard well thickness t2std in the well layer 152 is set larger than the standard barrier thickness t1std in the barrier layer 151.

Moreover, in the following description, of the first well layer 152a to the seventh well layer 152g constituting the well layer 152, the layer whose thickness is set at the standard well thickness t2std (in this specific example, the first well layer 152a to the fifth well layer 152e) is sometimes referred to as "standard thickness well layer". Further, in the following description, of the first well layer 152a to the seventh well layer 152g constituting the well layer 152, the layer whose thickness is set at the maximum well thickness t2max (in this specific example, the sixth well layer 152f and the seventh well layer 152g) is sometimes referred to as "maximum thickness well layer". It should be noted that, though not exist in the specific example shown in FIG. 3, one or more well layers whose thickness is set at "quasi-maximum well thickness", which is larger than the standard well thickness t2std and smaller than the maximum well thickness t2max, may exist between the standard thickness well layers and the maximum thickness well layers. In this case, the layer whose thickness is set at the quasi-maximum well thickness is sometimes referred to as "quasi-maximum thickness well layer".

Here, in the exemplary embodiment, the first well layer 152a to the fifth well layer 152e, which are the standard well layers, have a function as n-side well layers, and the sixth well layer 152f and the seventh well layer 152g, which are the maximum well layers, have a function as p-side well layers.

This time, description will be given of a relationship between the composition of each layer constituting the barrier layer 151 and the composition between the layers.

In the barrier layer 151, each of the first barrier layer 151a to the seventh barrier layer 151g whose thickness is set at the standard barrier thickness t1std and the eighth barrier layer 151h whose thickness is set at the maximum barrier thickness are composed of GaN. In other words, the first barrier layer 151a to the eighth barrier layer 151h constituting the barrier layer 151 have, regardless of the thicknesses thereof (regardless whether it is the standard thickness barrier layer or the maximum thickness barrier layer), the common composition.

Subsequently, description will be given of a relationship between the composition of each layer constituting the well layer 152 and the composition between the layers.

In the well layer 152, each of the first well layer 152a to the fifth well layer 152e whose thickness is set at the standard well thickness t2std is composed of $Ga_{1-y}In_yN$ ($0<y<0.4$). In other words, the first well layer 152a to the fifth well layer 152e, which are the standard thickness well layers, have the common standard well thickness t2std and the common composition.

On the other hand, in the well layer 152, the sixth well layer 152f and the seventh well layer 152g whose thicknesses are set at the maximum well thickness t2max are composed of $Ga_{1-z}In_zN$ ($z<y<0.4$). In other words, the sixth well layer 152f and the seventh well layer 152g, which are the maximum thickness well layers, have the different thickness and the different composition from the first well layer 152a to the fifth well layer 152e, which are the standard thickness well layers. To be described more specifically, each of the sixth well layer 152f and the seventh well layer 152g has the maximum well thickness t2max, which is larger than the common standard well thickness t2std in the first well layer 152a to the fifth well layer 152e, and has the common composition in which the ratio of In is reduced compared to that of the first well layer 152a to the fifth well layer 152e.

Here, the value of y in $Ga_{1-y}In_yN$ ($0<y<0.4$) that constitutes the first well layer 152a to the fifth well layer 152e (the standard thickness well layers) and the value of z in $Ga_{1-z}In_zN$ ($z<y<0.4$) that constitutes the sixth well layer 152f and the seventh well layer 152g (the maximum thickness well layers) are determined in accordance with a target light emission wavelength (corresponding to a common wavelength) of the semiconductor light emitting element 1. In the exemplary embodiment, both of the first well layer 152a to the fifth well layer 152e, which are the standard thickness well layers, and the sixth well layer 152f to the seventh well layer 152g, which are the maximum thickness well layers, are configured to output light having the common wavelength. Here, the reason why there is a difference in the thickness between the first well layer 152a to the fifth well layer 152e and the sixth well layer 152f to the seventh well layer 152g is that, if the film thickness falls at a quantum size region of less than 10 nm, an influence of the quantum-confined Stark effect becomes non negligible, and accordingly, not only the band gap energy of the group III nitride semiconductor constituting the film, but also the thickness thereof becomes a factor that determines the light emission wavelength.

[P-Type Semiconductor Layer]

The p-type semiconductor layer 160, in which holes are the carrier, includes the p-cladding layer 161 laminated on the light emitting layer 150 and the p-contact layer 162, which is laminated on the p-cladding layer 161 and on which the transparent conductive layer 170 is laminated. However, it is possible that the p-contact layer 162 also serves as the p-cladding layer 161.

The p-cladding layer 161 performs injection of the carriers (the holes here) into the light emitting layer 150 and confinement of carriers within the light emitting layer 150. The material of p-cladding layer 161 is not particularly limited as long as the band gap energy of the composition thereof is larger than that of the light emitting layer 150 and carriers can be confined within the light emitting layer 150; however, $Al_xGa_{1-x}N$ (0<x≤0.4) can be preferably used.

It is preferable that the p-cladding layer 161 is composed of such AlGaN in terms of confinement of carriers within the light emitting layer 150. The thickness of the p-cladding layer 161 is not particularly limited, but is preferably 1 nm to 400 nm, and more preferably 5 nm to 100 nm.

The p-type impurity concentration in the p-cladding layer 161 is preferably $1\times10^{18}/cm^3$ to $1\times10^{21}/cm^3$, and more preferably $1\times10^{19}/cm^3$ to $1\times10^{20}/cm^3$. It is preferable that the p-type impurity concentration is in the above ranges in terms of capability of suppressing deterioration of crystallinity in both of the p-cladding layer 161 and the p-contact layer 162 laminated on the p-cladding layer 161.

Moreover, similar to the above-described n-cladding layer 142, the p-cladding layer 161 may have a superlattice structure, and in this case, it is preferable to have an alternating structure of AlGaN and another AlGaN having different compositional ratio or an alternating structure of AlGaN and GaN having different compositions.

The p-contact layer 162 is a layer for providing the transparent conductive layer 170. The p-contact layer 162 is preferably composed of $Al_xGa_{1-x}N$ (0≤x≤0.4). It is preferable that Al composition is in the above-described range in terms of capability of maintaining excellent crystallinity and good ohmic contact with the transparent conductive layer 170.

The p-type impurity concentration in the p-contact layer 162 is preferably $1\times10^{18}/cm^3$ to $1\times10^{21}/cm^3$, and more preferably $1\times10^{19}/cm^3$ to $5\times10^{20}/cm^3$. It is preferable that the p-type impurity concentration is in the above range in the point that it becomes possible to maintain good ohmic contact, prevent cracking and maintain excellent crystallinity. The p-type impurities in the p-cladding layer 161 and the p-contact layer 162 are not particularly limited; however, for example, Mg can be preferably used.

The thickness of the p-contact layer 162 is not particularly limited, but is preferably 10 nm to 500 nm, and more preferably 50 nm to 200 nm. It is preferable to provide the thickness of the p-contact layer 162 in these ranges in the point that deterioration of light emission output in the semiconductor light emitting element 1 is suppressed.

<Transparent Insulating Layer>

As shown in FIG. 2, the transparent insulating layer 190 is laminated on a part on the p-type semiconductor layer 160. When the semiconductor light emitting element 1 is viewed in the planar view as shown in FIG. 1, the transparent insulating layer 190 is formed at a portion positioned beneath the p-side electrode 300 including the extending portion 310. This aims to increase the light emission efficiency by causing the current to be hardly supplied to the light emitting layer 150 positioned beneath the p-side electrode 300 that is opaque, to thereby facilitate flow of the current into the light emitting layer 150 positioned other than the portion beneath the p-side electrode 300. Since the light emitting layer 150 of the exemplary embodiment has great effect in the region of high current density, combination described above is preferable. However, the transparent insulating layer 190 is not limited to such a shape, but may be provided on the transparent conductive layer 170. Moreover, formation position of the transparent insulating layer 190 is not limited to the portion beneath the p-side electrode 300; however, the transparent insulating layer 190 may be formed in a lattice pattern or a tree pattern with some spacing. It should be noted that, as the structure of the transparent insulating layer 190, any structure including those known can be used without any limitation.

From above, as a material for constituting the transparent insulating layer 190, it is desirable to employ a material that is transparent to at least the wavelength of light emitted from the light emitting layer 150 and has a low refractive index to thereby cause large reflection at an interface between the p-contact layer 162 and the transparent insulating layer 190. As the electrical properties of the transparent insulating layer 190, insulating properties are preferable; however, if a material has high contact resistance with the p-contact layer 162 with respect to the transparent conductive layer 170, the material is not necessarily an insulating body. Specific examples of the transparent material with low refractive index and insulating properties for constituting the transparent insulating layer 190 include metal oxide or nitride such as $SiO_2$ (silicon dioxide), SiN (silicon nitride), $Al_2O_3$ (aluminum oxide) and titanium oxide. In addition, a multilayered film structure of these layers for increasing a reflectance is also preferable.

The thickness of the transparent insulating layer 190 is larger than a thickness for securing the insulating properties and reflection at the interface, and from a production viewpoint, it is desirable to set the thickness of the transparent insulating layer 190 not more than a thickness that eliminates the possibility of increase in costs and a break of the transparent conductive layer 170. Specifically, the thickness of the transparent insulating layer 190 is desirably 20 nm to 500 nm, and more desirably, 50 nm to 300 nm.

<Transparent Conductive Layer>

As shown in FIG. 2, the transparent conductive layer 170 is laminated on the p-type semiconductor layer 160.

As shown in FIG. 1, when the semiconductor light emitting element 1 is viewed in a planar view, the transparent conductive layer 170 (for example, indicated by the broken line in FIG. 1) is formed to cover almost all of the top surface of the p-type semiconductor layer 160, part of which has been removed by means of etching or the like so as to form the n-side electrode 400. However, the transparent conductive layer 170 is not limited to such a shape, but may be formed in a lattice pattern or a tree pattern with some spacing. It should be noted that, also as the structure of the transparent conductive layer 170, any structure including those known can be used without any limitation.

It is preferable that the transparent conductive layer 170 has a small contact resistance with the p-type semiconductor layer 160. Further, in the semiconductor light emitting element 1 of the exemplary embodiment, since the light from the light emitting layer 150 is extracted to the side on which the p-side electrode 300 is formed, it is preferable that the transparent conductive layer 170 has excellent transparency to the light emitted from the light emitting layer 150. Further, for uniformly passing a current over the entire surface of the p-type semiconductor layer 160, it is preferable that the transparent conductive layer 170 has excellent conductivity.

From above, as the material of the transparent conductive layer 170, it is preferable to use a conductive material having optical transparency composed of conductive oxide at least containing In. Specific examples of conductive oxides containing In include: ITO (indium tin oxide ($In_2O_3$—$SnO_2$)); IZO (indium zinc oxide ($In_2O_3$—ZnO)); IGO (indium gallium oxide ($In_2O_3$—$Ga_2O_3$)); and ICO (indium cerium oxide ($In_2O_3$—$CeO_2$)). It should be noted that impurities such as fluorine may be added to these materials.

The transparent conductive layer 170 can be formed by providing these materials by any well-known method in this technical field. Moreover, there are some cases where thermal processing is performed for improving transparency of the transparent conductive layer 170 after forming the transparent conductive layer 170.

In the exemplary embodiment, as the transparent conductive layer 170, a crystallized structure may be used, and in particular, a transparent material containing an $In_2O_3$ crystal having a crystal structure of a hexagonal system or a bixbyite structure (for example, ITO or IZO) can be preferably used.

For instance, in the case where IZO containing the $In_2O_3$ crystal having a crystal structure of a hexagonal system is used as the transparent conductive layer 170, an amorphous IZO film that has an excellent etching property can be used and processed into a specific shape, and thereafter, processed into an electrode that is superior in optical transparency than the amorphous IZO film by transferring the amorphous state into a structure containing crystals through a heat treatment or the like. The thickness of the transparent conductive layer 170 is not particularly limited, but may be in the range of, for example, 10 nm to 500 nm.

<Protecting Layer>

The protecting layer 180 is provided to suppress entry of water or the like into the inside of the semiconductor light emitting element 1. Further, in the exemplary embodiment, since the light from the light emitting layer 150 is extracted through the protecting layer 180, it is desirable that the protecting layer 180 has excellent transparency to the light emitted from the light emitting layer 150. Accordingly, in the exemplary embodiment, the protecting layer 180 is configured with $SiO_2$. However, the material constituting the protecting layer 180 is not limited thereto, and $TiO_2$, $Si_3N_4$, $SiO_2$—$Al_2O_3$, $Al_2O_3$, AlN or the like may be employed in place of $SiO_2$.

<P-Side Electrode>

The p-side electrode 300 is configured by laminating several kinds of metal layers. The p-side electrode 300 of the exemplary embodiment also serves as a so-called bonding pad, and a not-shown bonding wire is connected to a surface exposed to the outside.

The p-side electrode 300 can be formed anywhere on the transparent conductive layer 170. For example, the p-side electrode 300 may be formed at a position distant from the n-side electrode 400, or may be formed at a position to be the center of the semiconductor light emitting element 1. However, it is not preferable to form the p-side electrode 300 at a position too close to the n-side electrode 400 because, when bonding is performed, a short circuit is apt to occur between the bonding wires or between the bonding balls.

It should be noted that, in this specific example, when the semiconductor light emitting element 1 is viewed in a planar view as shown in FIG. 1, the p-side electrode 300 is configured to have a circular shape; however, not limited to such a shape, and for example, an arbitrary shape such as a polygonal shape can be selected.

Moreover, for uniformly supplying the current to the light emitting layer 150, the extending portion 310 having a thin line shape is provided to the p-side electrode 300. The extending portion 310 can be designed in a suitable shape, length, thickness or number thereof in accordance with the size or shape of the light emitting layer 150.

<N-Side Electrode>

Similar to the p-side electrode 300, the n-side electrode 400 is configured by laminating several kinds of metal layers. The n-side electrode 400 of the exemplary embodiment also serves as a so-called bonding pad, and a not-shown bonding wire is connected to a surface exposed to the outside.

It should be noted that, in this example, in a planar view as shown in FIG. 1, the n-side electrode 400 shows a semicylindrical shape. However, similar to the p-side electrode 300 as described above, it is possible to select any shape such as a circle or a polygon.

From a viewpoint similar to that of the above-described p-side electrode 300, it is desirable to provide an extending portion having a thin line shape to the n-side electrode 400 for uniformly supplying a current to the light emitting layer 150. The extending portion of the n-side electrode 400 can also be designed in a suitable shape, length, thickness or number thereof in accordance with the size or shape of the light emitting layer 150.

(Light Emitting Device)

Figure 4A:
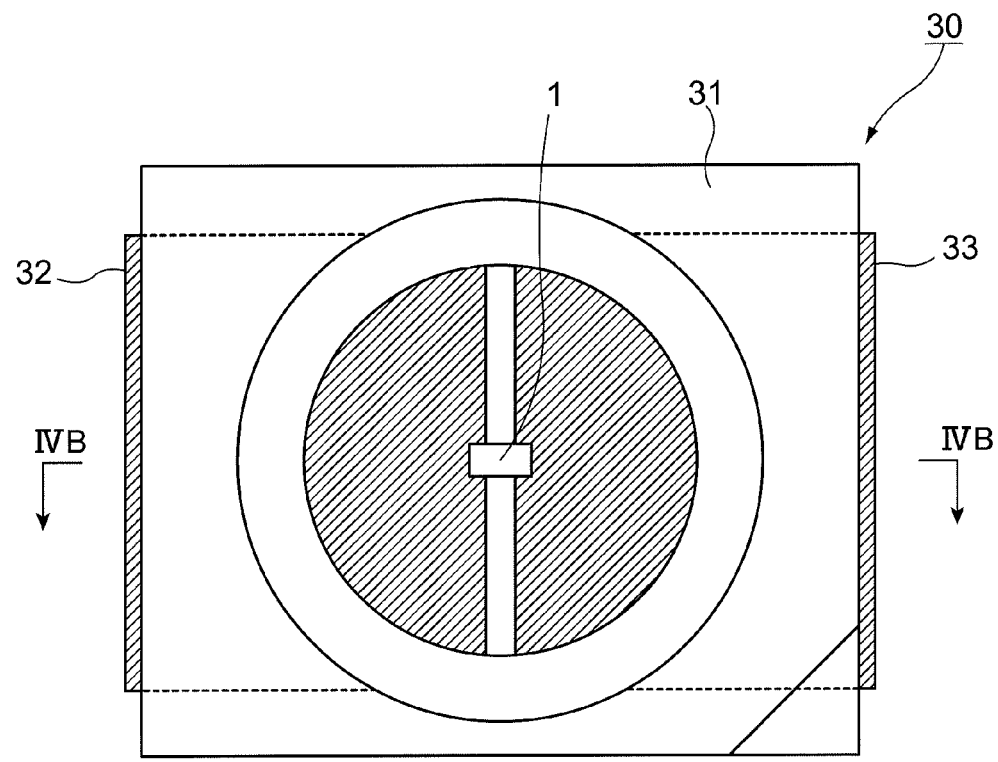
FIGS. 4A and 4B are diagrams showing a specific example of a configuration of a light emitting device that mounts the semiconductor light emitting element.
Figure 4B:
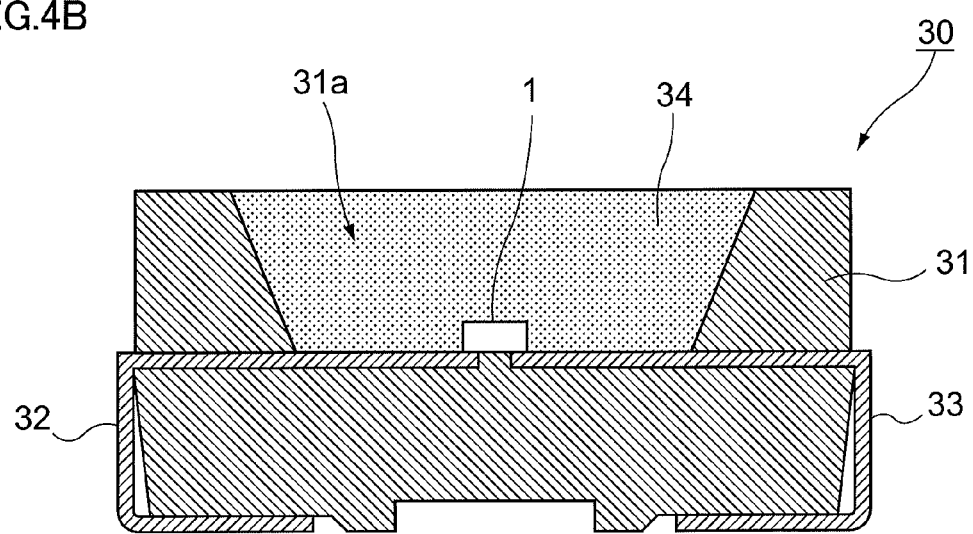

FIGS. 4A and 4B are diagrams showing a specific example of a configuration of a light emitting device 30 that mounts the above-described semiconductor light emitting element 1. Here, FIG. 4A shows a top surface view of the light emitting device 30, and FIG. 4B is a IVB-IVB cross-sectional view in FIG. 4A. It should be noted that the light emitting device 30 shown in FIGS. 4A and 4B is referred to as "light emitting chip" or "lamp" in some cases.

The light emitting device 30 includes: a housing 31 on one side of which a concave section 31a is formed; a p-lead section 32 and an n-lead section 33 composed of lead frames formed in the housing 31; the semiconductor light emitting element 1 attached to a bottom surface of the concave section 31a; and a sealing section 34 provided to cover the concave section 31a. It should be noted that an illustration of the sealing section 34 is omitted in FIG. 4A.

The housing 31 as a specific example of a base section is formed by injection molding of a white thermoplastic resin on a metal lead section including the p-lead section 32 as a specific example of a first wiring and the n-lead section 33 as a specific example of a second wiring.

The p-lead section 32 and the n-lead section 33 are metal plates having a thickness of the order of 0.1 mm to 0.5 mm, and configured by laminating several μm of nickel, titanium, gold or silver as a plating layer on an alloy of iron and copper, for example, which is a metal having excellent workability and thermal conductivity, as a base. Then, in the exemplary embodiment, part of each of the p-lead section 32 and the n-lead section 33 is exposed at the bottom surface of the concave section 31a. Further, one end portion of each of the p-lead section 32 and the n-lead section 33 is exposed to the outside of the housing 31 and is bent from an outer wall surface toward a back surface side of the housing 31.

The semiconductor light emitting element 1 is attached by bonding or the like to the center portion of the bottom portion in the concave section 31a via the substrate 110 (refer to FIG. 2). Further, the p-lead section 32 and the p-side electrode 300 (refer to FIG. 1) in the semiconductor light emitting element 1 are electrically connected by the not-shown bonding wire, and the n-lead section 33 and the n-side electrode 400 (refer to FIG. 1) in the semiconductor light emitting element 1 are electrically connected by the not-shown bonding wire.

The sealing section 34 is configured with a transparent resin having high optical transparency in a visible region wavelength. As the resin constituting the sealing section 34, which satisfies the properties of high heat resistance, high weather resistance and high mechanical strength, for example, an epoxy resin or a silicone resin can be used. In the exemplary embodiment, the transparent resin constituting the sealing section 34 contains a phosphor that converts a part of the light emitted from the semiconductor light emitting element 1 into green light and red light. It should be noted that, instead of such a phosphor, a phosphor that converts a part of blue light into yellow light or a phosphor that converts a part of blue light into yellow light and red light may be contained. As the sealing section 34, a transparent resin without containing a phosphor may also be used.

It should be noted that an electronic appliance, such as a backlight, a mobile cellular telephone, a display, various kinds of panels and the like, a computer, a game machine and illumination incorporating the light emitting device 30 according to the exemplary embodiment, and a mechanical device incorporating those electronic appliances, such as an automobile, is equipped with the semiconductor light emitting element 1 having excellent light emitting properties. Especially, in the electronic appliance, such as the backlight, the mobile cellular telephone, the display, the game machine and the illumination, that is battery operated, an excellent product equipped with the semiconductor light emitting element 1 having excellent light emitting properties can be provided; and therefore, it is favorable. In addition, the configuration of the light emitting device 30 including the semiconductor light emitting element 1 is not limited to that shown in FIGS. 4A and 4B, and a package configuration called, for example, a shell type may be employed.

Then, description will be given of light emitting operation of the light emitting device 30 shown in FIGS. 4A and 4B with reference to FIGS. 1 to 3, 4A and 4B.

When a voltage in which the p-side electrode 300 is at the high potential and the n-side electrode 400 is at the low potential (a forward voltage VF) is applied to the semiconductor light emitting element 1 via the p-lead section 32 and the n-lead section 33 provided to the light emitting device 30, a current (a forward current IF) passes from the p-side electrode 300 toward the n-side electrode 400 through the p-type semiconductor layer 160, the light emitting layer 150 and the n-type semiconductor layer 140, and thereby light of the target wavelength (in this specific example, blue light) is outputted from the light emitting layer 150.

The light outputted from the light emitting layer 150 is further outputted to the outside of the semiconductor light emitting element 1, and part of the light is converted into light of other colors (red and green) by the phosphor contained in the sealing section 34. Thereafter, the light containing blue light, green light and red light is outputted from a top surface of the sealing section 34 to the outside of the light emitting device 30 directly or after being reflected by an inner wall surface provided in the concave section 31a of the housing 31.

In the meantime, in the semiconductor light emitting element 1, output of light is performed as follows.

First, the forward current IF passes from the p-side electrode 300 toward the n-side electrode 400 through the p-type semiconductor layer 160, the light emitting layer 150 and the n-type semiconductor layer 140. At this time, the holes as the carrier are supplied to the light emitting layer 150 from the p-type semiconductor layer 160, and the electrons as the carrier are supplied to the light emitting layer 150 from the n-type semiconductor layer 140.

Then, in the light emitting layer 150, the holes move from the eighth barrier layer 151h toward the first barrier layer 151a, and the electrons move from the first barrier layer 151a toward the eighth barrier layer 151h. The holes and the electrons moving inside the light emitting layer 150 are confined and recombined in each of the first well layer 152a to the seventh well layer 152g. The recombination includes light-emission recombination accompanied by light emission and non-light-emission recombination not accompanied by light emission, and light (in this specific example, blue light) is outputted by the holes and the electrons recombined as the light-emitting recombination.

Here, it is known that, in the group III nitride semiconductor, the mobility of holes is low compared to the mobility of electrons. Consequently, the distribution of holes in the well layer 152 of the light emitting layer 150 is the highest in the seventh well layer 152g, which is near the p-type semiconductor layer 160 (most distant from the n-type semiconductor layer 140), and is sequentially reduced in the sixth well layer 152f to the first well layer 152a located away from the p-type semiconductor layer 160 (approaching the n-type semiconductor layer 140). On the other hand, the distribution of electrons in the well layer 152 of the light emitting layer 150 is not largely different in each of the layers (the first well layer 152a to the seventh well layer 152g) from the first well layer 152a, which is nearest the n-type semiconductor layer 140 (most distant from the p-type semiconductor layer 160), to the seventh well layer 152g, which is nearest the p-type semiconductor layer 160 (most distant from the n-type semiconductor layer 140).

Accordingly, the above-described recombination process is most likely to occur in the seventh well layer 152g, which is nearest the p-type semiconductor layer 160, and is hardest to occur in the first well layer 152a, which is nearest the n-type semiconductor layer 140.

Moreover, in some cases, part of the electrons which are higher in mobility than the holes directly reaches the p-type semiconductor layer 160 without being recombined with the holes in the light emitting layer 150 (the well layer 152). A phenomenon like this is referred to as "overflow".

In the exemplary embodiment, of the first well layer 152a to the seventh well layer 152g constituting the well layer 152, the seventh well thickness t2g of the seventh well layer 152g (the final well layer), which is nearest the p-type semiconductor layer 160, and the sixth well thickness t2f of the sixth well layer 152f (the quasi-final well layer), which is next nearest the p-type semiconductor layer 160, are set at the maximum well thickness t2max that is thicker than any of the first well thickness t2a to the fifth well thickness (the standard well thickness t2std) of the remaining first well layer 152a to fifth well layer 152e. This makes it possible to increase the amount of holes existing in the sixth well layer 152f and the seventh well layer 152g compared to the case where all the thicknesses of the first well layer 152a to the seventh well layer 152g are set at the standard well thickness t2std. Accordingly, the amount of recombination of the holes and the electrons can be increased in both the sixth well layer 152f and the seventh well layer 152g, and thereby overflow of electrons described above can be suppressed. As a result, in comparison with the case where no such configuration is provided, it becomes possible to increase the amount of holes and electrons that undergo light emission recombination in the sixth well layer 152f and the seventh well layer 152g. In consequence of the above-described matter, it is possible to improve the light emission efficiency in the semiconductor light emitting element 1, which in turn to increase the light emission output Po from the semiconductor light emitting element 1.

Moreover, in the case of employing the configuration of the exemplary embodiment, compared to the case where, of the first well layer 152a to the seventh well layer 152g constituting the well layer 152, the thickness of only the seventh well layer 152g (the final well layer), which is nearest the p-type semiconductor layer 160 is set at the maximum well thickness t2max and the thickness of each of the other layers, namely, the first well layer 152a to the sixth well layer 152f, is set at the standard well thickness t2std, fluctuations in the light emission output Po due to an environmental temperature of the semiconductor light emitting element 1 become easy to be suppressed. To be described more specifically, adoption of the configuration of the exemplary embodiment makes it possible to suppress reduction of the light emission output Po from the semiconductor light emitting element 1 with the increase in the environmental temperature of the place where the semiconductor light emitting element 1 is provided.

Moreover, in the exemplary embodiment, of the first well layer 152*a* to the seventh well layer 152*g* constituting the well layer 152, the first well thickness t2*a* of the first well layer 152*a*, which is nearest the n-type semiconductor layer 140, and the second well thickness t2*b* to the fifth well thickness t2*e* of the second well layer 152*b* to the fifth well layer 152*e* that follow the first well layer 152*a* are set smaller than the sixth well thickness t2*f* of the sixth well layer 152*f* and the seventh well thickness t2*g* of the seventh well layer 152*g*, and are set at the common (constant) standard well thickness t2std. This makes it possible to simplify the production processes of the semiconductor light emitting element 1 compared to the case where the first well thickness t2*a* to the fifth well thickness t2*e* of the first well layer 152*a* to the fifth well layer 152*e* are not set in common thickness. In addition, deterioration of crystallinity in the sixth well layer 152*f* and the seventh well layer 152*h*, which are the maximum thickness well layers laminated at the end in the well layer 152, can be suppressed.

Moreover, in the case of using GaInN as the well layer 152, crystallinity of the quasi-final well layer (in this specific example, the sixth well layer 152*f*) and the final well layer (in this specific example, the seventh well layer 152*g*) that are laminated at the end of the well layer 152 is prone to be deteriorated. This is because, in GaInN, a very small amount of In added to Ga hardly enters into the crystal. In this specific example, since the thicknesses of the first well layer 152*a* to the fifth well layer 152*e* that are laminated prior to the sixth well layer 152*f* are set at a common value, and compositions thereof are also commonly set, it is possible to suppress deterioration of crystallinity in the sixth well layer 152*f* and the seventh well layer 152*g*. Then, as the deterioration of crystallinity in the sixth well layer 152*f* and the seventh well layer 152*g* can be suppressed, it becomes possible to suppress occurrence of non-light-emission recombination in the sixth well layer 152*f* and the seventh well layer 152*g*; in other words, it becomes possible to increase the rate of light-emission recombination in the recombination in the sixth well layer 152*f* and the seventh well layer 152*g*. As a result, the light emission efficiency in the semiconductor light emitting element 1 can be improved, which in turn, the light emission output Po from the semiconductor light emitting element 1 can be increased.

Further, in the exemplary embodiment, of the first well layer 152*a* to the seventh well layer 152*g* constituting the well layer 152, the compositions of the group III nitride semiconductor in the sixth well layer 152*f* and the seventh well layer 152*g*, which are the maximum thickness well layers, are made different from the composition of the group III nitride semiconductor in each of the first well layer 152*a* to the fifth well layer 152*e*, which are the standard thickness well layers. To be described more specifically, in the exemplary embodiment, each of the first well layer 152*a* to the seventh well layer 152*g* is composed of GaInN, and the density of In in the sixth well layer 152*f* and the seventh well layer 152*g* is set smaller than the density of In in each of the first well layer 152*a* to the fifth well layer 152*e*. By performing such settings of the density of In, deterioration of crystallinity in the sixth well layer 152*f* and the seventh well layer 152*g*, which are the maximum thickness well layers, can also be suppressed.

In the case where the first well layer 152*a* to the seventh well layer 152*g* have the common composition, and the thickness of each of the sixth well layer 152*f* and the seventh well layer 152*g* is larger than the thickness of each of the first well layer 152*a* to the fifth well layer 152*e*, in comparison with the wavelength (the common wavelength) of light outputted from the first well layer 152*a* to the fifth well layer 152*e*, the wavelength of light outputted from the sixth well layer 152*f* and the seventh well layer 152*g* is shifted to the longer wavelength side (red shift) by the above-described quantum-confined Stark effect. On the other hand, in the exemplary embodiment, against the composition of the first well layer 152*a* to the fifth well layer 152*e* (the common composition), the composition of the sixth well layer 152*f* and the seventh well layer 152*g* is shifted to the shorter wavelength side (blue shift) by reducing In, to thereby justify the wavelength of light outputted from the first well layer 152*a* to the fifth well layer 152*e* and the wavelength of light outputted from the sixth well layer 152*f* and the seventh well layer 152*g*. Accordingly, in comparison with the case where this configuration is not adopted, it is possible to improve the light emission efficiency and the light emission output Po of the semiconductor light emitting element 1 while suppressing deterioration of monochromaticity of wavelength in the semiconductor light emitting element 1. In particular, the light emission output Po is greatly improved in the region of high current density where the forward current IF is increased.

Still further, in the exemplary embodiment, of the first barrier layer 151*a* to the eighth barrier layer 151*h* constituting the barrier layer 151, the eighth barrier thickness t1*h* of the eighth barrier layer 151*h* (the final barrier layer) adjacent to the p-type semiconductor layer 160 side is set at the maximum barrier thickness t1max, which is larger than the standard barrier thickness of the remaining first barrier layer 151*a* to seventh barrier layer 151*g*. This makes it easy to suppress fluctuations in the light emission output Po with respect to the environmental temperature in the place where the semiconductor light emitting element 1 is provided, compared to the case where the eighth barrier thickness t1*h* of the eighth barrier layer 151*h* is set at the same as the standard barrier thickness t1std. To be described more specifically, by adopting the above-described configuration, it becomes possible to suppress decrease of the light emission output Po from the semiconductor light emitting element 1 with the increase in the environmental temperature in the place where the semiconductor light emitting element 1 is provided.

Then, in the exemplary embodiment, the n-cladding layer 142 that constitutes the n-type semiconductor layer 140, on which the light emitting layer 150 is laminated, is configured with the superlattice structure including the plural n-first cladding layers 1421 and the plural n-second cladding layers 1422. If the n-cladding layer 142 has the superlattice structure, crystal defects in the n-contact layer 141, on which the n-cladding layer 142 is laminated, are hardly propagated to an upper layer (here, the light emitting layer 150). Accordingly, in comparison with the case where the present configuration is not adopted, crystallinity in the light emitting layer 150 (in this specific example, the quantum well structure including the barrier layer 151 with 8-layer configuration and the well layer 152 with 7-layer configuration) laminated on the n-cladding layer 142 that has the superlattice structure becomes more excellent. Therefore, it becomes possible to suppress occurrence of the non-light-emission recombination in each of the first well layer 152*a* to the seventh well layer 152*g* constituting the well layer 152, in other words, it becomes possible to increase the rate of light-emission recombination in the recombination in each of the first well layer 152*a* to the seventh well layer 152g. As a result, the light emission efficiency in the semiconductor light emitting element 1 can be improved, which in turn, the light emission output Po from the semiconductor light emitting element 1 can be increased.

It should be noted that, here, the first barrier layer 151a to the eighth barrier layer 151h in the barrier layer 151 are composed of GaN and the first well layer 152a to the seventh well layer 152g in the well layer 152 are composed of GaInN; however, the configurations are not limited thereto. In other words, it may be sufficient that both of the barrier layer 151 and the well layer 152 are composed of the group III nitride semiconductor, and the band gap energy of the group III nitride semiconductor used as the barrier layer 151 is set larger than the band gap energy of the group III nitride semiconductor used as the well layer 152. Here, in the case where the first well layer 152a to the seventh well layer 152g constituting the well layer 152 are composed of GaInN, as the first barrier layer 151a to the eighth barrier layer 151h constituting the barrier layer 151, it is possible to use, for example, $Al_xGa_{1-x}N$ ($0 \le x < 0.3$).

Moreover, here, description has been given of the case where the barrier layer 151 is provided in the 8-layer configuration (the first barrier layer 151a to the eighth barrier layer 151h) and the well layer 152 is provided in the 7-layer configuration (the first well layer 152a to the seventh well layer 152g) as a specific example; however, the configurations of these layers are not limited thereto. The present invention allows a case where the barrier layer 151 is provided in a 5-layer configuration (the first barrier layer 151a to the fifth barrier layer 151e) and the well layer 152 is provided in a 4-layer configuration (the first well layer 152a to the fourth well layer 152d), and the first well layer 152a and the second well layer 152b are set as the standard thickness well layers and the third well layer 152c and the fourth well layer 152d are set as the layers thicker than the standard thickness well layer (for example, the maximum thickness well layer), as a minimum configuration.

Further, here, description has been given of the case where the two layers, namely, the final well layer (the seventh well layer 152g) and the quasi-final well layer (the sixth well layer 152f) are assumed to be the maximum thickness well layers as a specific example; however, the configuration is not limited thereto. For example, it may be possible that the final well layer (the seventh well layer 152g) is set as the maximum thickness well layer and the quasi-final well layer (the sixth well layer 152f) is set as the quasi-maximum-thickness well layer. In addition, as long as there are two or more standard thickness well layers on a side closer to the n-type semiconductor layer 140, there may be three or more maximum thickness well layers on a side closer to the p-type semiconductor layer 160.

Examples

Hereinafter, the present invention will be described further in detail with reference to examples. However, the present invention is not limited to the following examples as long as the scope of the gist thereof is not exceeded.

The present inventors formed the semiconductor light emitting elements 1 in which the thicknesses and compositions in the barrier layer 151 and the well layer 152 in the light emitting layer 150 were variously different, and performed various kinds of evaluations to be described as follows.

Here, Table 1 shows the configurations of the semiconductor light emitting elements 1 according to Examples 1 and 2, and Comparative Examples 1 and 2. To be specifically, Table 1 shows, in each of the semiconductor light emitting elements 1, the thickness (nm) and composition in each layer constituting the barrier layer 151, the thickness (nm) and composition in each layer constituting the well layer 152, the total barrier layer thickness t1, which is a total thickness of the barrier layer 151 (in the table, referred to as a total thickness (nm)), and the total well layer thickness t2, which is a total thickness of the well layer 152 (in the table, referred to as a total thickness (nm)).

It should be noted that, in each Example and Comparative Example, the substrate 110, the intermediate layer 120, the base layer 130, the n-type semiconductor layer 140, the p-type semiconductor layer 160, the transparent conductive layer 170, the protecting layer 180, the transparent insulating layer 190, the p-side electrode 300 and the n-side electrode 400 were commonly configured. Moreover, the semiconductor light emitting element 1 described in the above exemplary embodiment corresponds to Example 1 shown in Table 1. The arrow shown in Table 1 means the same value or the like as that on the left.

TABLE 1

| | | Example 1 | Example 2 | Comparative Example 1 | Comparative Example 2 |
|---|---|---|---|---|---|
| First Barrier Layer 151a | Thickness (nm) | 2.5 | → | → | → |
| | Composition | GaN | → | → | → |
| First Well Layer 152a | Thickness (nm) | 3.5 | → | → | → |
| | Composition | A | → | → | → |
| Second Barrier Layer 151b | Thickness (nm) | 2.5 | → | → | → |
| | Composition | GaN | → | → | → |
| Second Well Layer 152b | Thickness (nm) | 3.5 | → | → | → |
| | Composition | A | → | → | → |
| Third Barrier Layer 151c | Thickness (nm) | 2.5 | → | → | → |
| | Composition | GaN | → | → | → |
| Third Well Layer 152c | Thickness (nm) | 3.5 | → | → | → |
| | Composition | A | → | → | → |
| Fourth Barrier Layer 151d | Thickness (nm) | 2.5 | → | → | → |
| | Composition | GaN | → | → | → |
| Fourth Well Layer 152d | Thickness (nm) | 3.5 | → | → | → |
| | Composition | A | → | → | → |
| Fifth Barrier Layer 151e | Thickness (nm) | 2.5 | → | → | → |
| | Composition | GaN | → | → | → |
| Fifth Well Layer 152e | Thickness (nm) | 3.5 | → | → | → |
| | Composition | A | → | → | → |
| Sixth Barrier Layer 151f | Thickness (nm) | 2.5 | → | → | → |
| | Composition | GaN | → | → | → |
| Sixth Well Layer 152f | Thickness (nm) | 4.1 | → | 3.5 | → |
| | Composition | B | → | A | → |
| Seventh Barrier Layer 151g | Thickness (nm) | 2.5 | → | → | → |
| | Composition | GaN | → | → | → |
| Seventh Well Layer 152g | Thickness (nm) | 4.1 | 4.2 | 4.7 | 3.5 |
| | Composition | B | C | D | A |
| Eighth Barrier Layer 151h | Thickness (nm) | 4.0 | → | → | → |
| | Composition | GaN | → | → | → |
| Barrier Layer 151 | Total Thickness (nm) | 21.5 | → | → | → |
| Well Layer 152 | Total Thickness (nm) | 25.7 | 25.8 | 25.7 | 24.5 |

Here, compositions A, B, C and D shown in Table 1 are as follows.

Composition A: $Ga_{0.930}In_{0.070}N$

Composition B: $Ga_{0.940}In_{0.060}N$

Composition C: $Ga_{0.944}In_{0.056}N$

Composition D: $Ga_{0.953}In_{0.047}N$  [Expression 1]

Next, common points and different points in the examples (Examples 1 and 2) and the comparative examples (Comparative Examples 1 and 2) will be described.

First, the semiconductor light emitting elements 1 indicated in Examples 1 and 2 and Comparative Examples 1 and 2 are common in the point that each of the semiconductor light emitting elements 1 includes the light emitting layer 150 of 15-layer configuration in which the barrier layer 151 includes the first barrier layer 151a to the eighth barrier layer 151h (8 layers) and the well layer 152 includes the first well layer 152a to the seventh well layer 152g (7 layers). Moreover, Examples 1 and 2 and Comparative Examples 1 and 2 are also common in the point that the eighth barrier layer 151h, which is the final barrier layer in the barrier layer 151, is the maximum thickness barrier layer, and all of the first barrier layer 151a to the seventh barrier layer 151g, which are other layers than the eighth barrier layer 151h in the barrier layer 151, are the standard thickness barrier layers. Further, Examples 1 and 2 and Comparative Examples 1 and 2 are also common in the point that, in the well layer 152 in the light emitting layer 150, all of the first well layer 152a to the fifth well layer 152e, which are other than the sixth well layer 152f and the seventh well layer 152g, are the standard thickness well layers.

Next, Examples 1 and 2 are common in the point that the seventh well layer 152g, which is the final well layer, is the maximum thickness well layer in the well layer 152 in the light emitting layer 150. However, there is a difference in the point that the sixth well layer 152f, which is the quasi-final well layer, is the maximum thickness well layer in Example 1, whereas the sixth well layer 152f, which is the quasi-final well layer, is the quasi-maximum thickness well layer in Example 2.

Subsequently, Example 1 and Comparative Example 1 are common in the point that the seventh well layer 152g, which is the final well layer, is the maximum thickness well layer in the well layer 152 in the light emitting layer 150. However, there is a difference in the point that the sixth well layer 152f, which is the quasi-final well layer, is the maximum thickness well layer in Example 1, whereas the sixth well layer 152f, which is the quasi-final well layer, is the standard thickness well layer in Comparative Example 1.

Moreover, Example 1 and Comparative Example 2 have a difference in the point that, in Example 1, each of the seventh well layer 152g, which is the final well layer, and the sixth well layer 152f, which is the quasi-final well layer, is the maximum thickness well layer, whereas, in Comparative Example 2, each of the seventh well layer 152g, which is the final well layer, and the sixth well layer 152f, which is the quasi-final well layer, is the standard thickness well layer.

Further, Example 2 and Comparative Example 1 are common in the point that the seventh well layer 152g, which is the final well layer, is the maximum thickness well layer in the well layer 152 in the light emitting layer 150. However, there is a difference in the point that the sixth well layer 152f, which is the quasi-final well layer, is the quasi-maximum thickness well layer in Example 2, whereas, the sixth well layer 152f, which is the quasi-final well layer, is the standard thickness well layer in Comparative Example 1.

Still further, Example 2 and Comparative Example 2 have a difference in the point that, in Example 2, the seventh well layer 152g, which is the final well layer, is the maximum thickness well layer and the sixth well layer 152f, which is the quasi-final well layer, is the quasi-maximum thickness well layer, whereas, in Comparative Example 2, each of the seventh well layer 152g, which is the final well layer, and the sixth well layer 152f, which is the quasi-final well layer, is the standard thickness well layer.

Comparative Example 1 and Comparative Example 2 are common in the point that the sixth well layer 152f, which is the quasi-final well layer, is the standard thickness well layer. However, there is a difference in the point that the seventh well layer 152g, which is the final well layer, is the maximum thickness well layer in Comparative Example 1, whereas, the seventh well layer 152g, which is the final well layer, is the standard thickness well layer in Comparative Example 2.

Then, the method of evaluation and the results of evaluation will be described.

Figure 5:
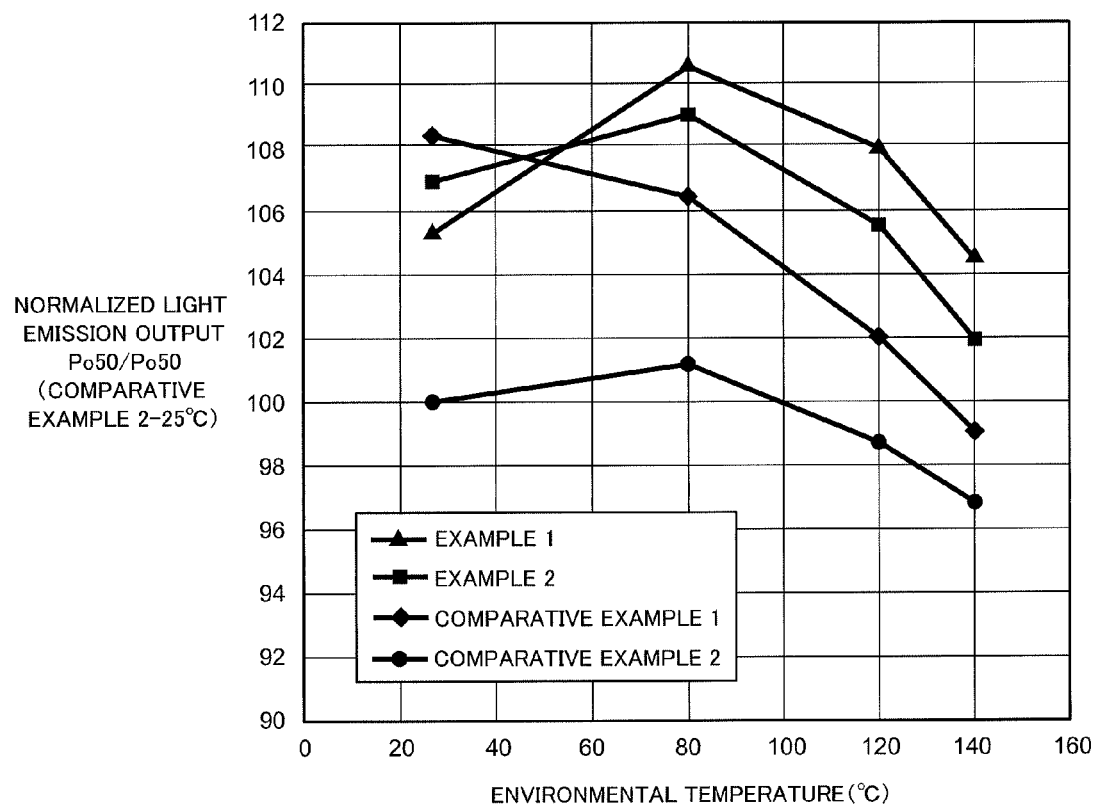
FIG. 5 is a graph showing a relationship between an environmental temperature of a place where each semiconductor light emitting element is provided and light emission output when a current of 50 mA is passed through each semiconductor light emitting element as a forward current.

FIG. 5 is a graph showing a relationship between the environmental temperature (° C.) of the place where each semiconductor light emitting element 1 is provided and the light emission output Po when the forward current IF of 50 mA is passed through each semiconductor light emitting element 1 (in the figure, indicated as Po50). Here, the vertical axis in FIG. 5 indicates normalized light emission output that regards a result of Comparative Example 2, in which the all of the first well layer 152a to seventh well layer 152g constituting the well layer 152 are set as the standard thickness well layers, at the environmental temperature of 25° C. as a reference and normalizes other results (in the figure, indicated as normalized light emission output Po50/Po50 (Comparative Example 2-25° C.), and hereinafter, referred to as "first normalized light emission output").

Figure 6:
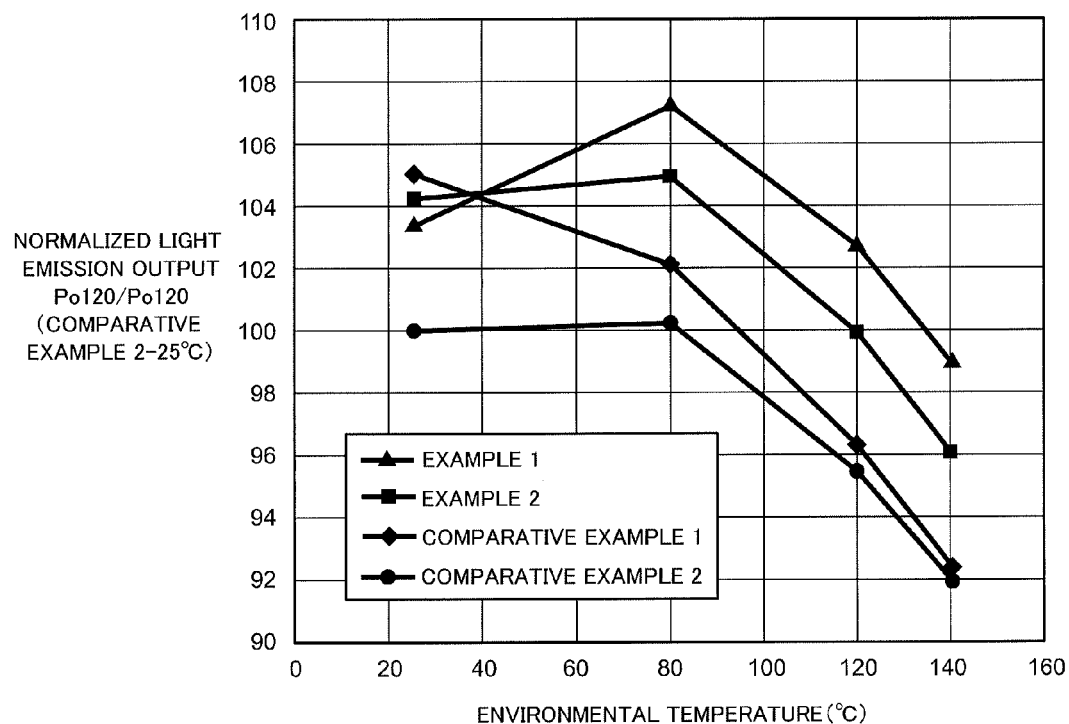
FIG. 6 is a graph showing a relationship between an environmental temperature of a place where each semiconductor light emitting element is provided and light emission output when a current of 120 mA is passed through each semiconductor light emitting element as a forward current.

FIG. 6 is a graph showing a relationship between the environmental temperature (° C.) of the place where each semiconductor light emitting element 1 is provided and the light emission output Po when the forward current IF of 120 mA is passed through each semiconductor light emitting element 1 (in the figure, indicated as Po120). Here, the vertical axis in FIG. 6 indicates normalized light emission output that regards a result of Comparative Example 2, in which the all of the first well layer 152a to seventh well layer 152g constituting the well layer 152 are set as the standard thickness well layers, at the environmental temperature of 25° C. as a reference and normalizes other results (in the figure, indicated as normalized light emission output Po120/Po120 (Comparative Example 2-25° C.), and hereinafter, referred to as "second normalized light emission output").

It should be noted that, in this specific example, since each Example and each Comparative Example shows the same tendency in both FIGS. 5 and 6, both results will be collectively described hereinbelow.

In Example 1, the first normalized light emission output at 80° C. is higher than the first normalized light emission output at 25° C., and the second normalized light emission output at 80° C. is higher than the second normalized light emission output at 25° C. Moreover, in Example 1, though the first normalized light emission output at 120° C. is decreased compared to the first normalized light emission output at 80° C., but is capable of maintaining a state higher than the first normalized light emission output at 25° C. In contrast, in Example 1, the second normalized light emission output at 120° C. is decreased compared to the second normalized light emission output at 80° C., and is in a state slightly lower than second normalized light emission output at 25° C. Further, in Example 1, the first normalized light emission output at 140° C. is decreased compared to the first normalized light emission output at each of 25° C., 80° C. and 120° C., and the second normalized light emission output at 140° C. is decreased compared to the second normalized light emission output at each of 25° C., 80° C. and 120° C.

In Example 2, similar to Example 1, the first normalized light emission output at 80° C. is higher than the first normalized light emission output at 25° C., and the second normalized light emission output at 80° C. is higher than the second normalized light emission output at 25° C. Moreover, in Example 2, the first normalized light emission output at 120° C. is decreased compared to the first normalized light emission output at each of 25° C. and 80° C., and the second normalized light emission output at 120° C. is decreased compared to the second normalized light emission output at each of 25° C. and 80° C. Further, in Example 2, the first normalized light emission output at 140° C. is decreased compared to the first normalized light emission output at each of 25° C., 80° C. and 120° C., and the second normalized light emission output at 140° C. is decreased compared to the second normalized light emission output at each of 25° C., 80° C. and 120° C.

In Comparative Example 1, the first normalized light emission output at 80° C. is lower than the first normalized light emission output at 25° C., and the second normalized light emission output at 80° C. is lower than the second normalized light emission output at 25° C. Moreover, in Comparative Example 2, the first normalized light emission output at 120° C. is decreased compared to the first normalized light emission output at 80° C., and the second normalized light emission output at 120° C. is decreased compared to the second normalized light emission output at 80° C. Further, in Comparative Example 1, the first normalized light emission output at 140° C. is decreased compared to the first normalized light emission output at each of 25° C., 80° C. and 120° C., and the second normalized light emission output at 140° C. is decreased compared to the second normalized light emission output at each of 25° C., 80° C. and 120° C.

In Comparative Example 2, the first normalized light emission output at 80° C. is higher than the first normalized light emission output at 25° C., and the second normalized light emission output at 80° C. is higher than the second normalized light emission output at 25° C. Moreover, in Comparative Example 2, the first normalized light emission output at 120° C. is decreased compared to the first normalized light emission output at 80° C., and the second normalized light emission output at 120° C. is decreased compared to the second normalized light emission output at 80° C. Further, in Comparative Example 2, the first normalized light emission output at 140° C. is decreased compared to the first normalized light emission output at each of 25° C., 80° C. and 120° C., and the second normalized light emission output at 140° C. is decreased compared to the second normalized light emission output at each of 25° C., 80° C. and 120° C.

Here, when Examples 1 and 2 are compared to Comparative Example 1, the light emission output in Examples 1 and 2 is higher than the light emission output in Comparative Example 1 in the range of environmental temperature from not less than 80° C. to not more than 140° C.

Moreover, when Examples 1 and 2 are compared to Comparative Example 2, the light emission output in Examples 1 and 2 is higher than the light emission output in Comparative Example 2 in the range of environmental temperature from not less than 25° C. to not more than 140° C.

Further, when Example 1 is compared to Example 2, the light emission output in Example 1 is higher than the light emission output in Example 2 in the range of environmental temperature from not less than 80° C. to not more than 140° C.

As uses of semiconductor light emitting elements, recently, uses with particularly high current density (for example, illumination or the like) are expanded. In these uses, the environmental temperature is increased due to self-heating of the light emitting element by passing a high current, to thereby reach 60° C. or more in many cases. Moreover, with respect to the semiconductor light emitting elements, it is known that the light emission efficiency thereof is decreased due to increase of an amount of electrons and holes that undergo non-light-emission combination with the increase in the environmental temperature.

For example, by setting both of the final well layer and the quasi-final well layer as the maximum thickness well layers as in Example 1, or, for example, by setting the final well layer as the maximum thickness well layer and setting the quasi-final well layer as the quasi-maximum thickness well layer as in Example 2, it becomes possible to improve the light emission output regardless of the environmental temperature compared to the case where all the well layers up to the final well layer are set as the standard thickness well layers as in Comparative Example 2.

Moreover, for example, by setting both of the final well layer and the quasi-final well layer as the maximum thickness well layers as in Example 1, or, for example, by setting the final well layer as the maximum thickness well layer and setting the quasi-final well layer as the quasi-maximum thickness well layer as in Example 2, it becomes possible to suppress decrease of the light emission output with the increase in the environmental temperature compared to the case where only the final well layer is set as the maximum thickness well layer as in Comparative Example 1.

Then, in the case where the configuration described in Example 1 or Example 2 is adopted, it becomes possible to suppress decrease of the light emission output with the increase in the environmental temperature not only in a low current region (IF=50 mA) but also in a high current region (IF=120 mA).

Further, for example, by setting both of the final well layer and the quasi-final well layer as the maximum thickness well layers as in Example 1, it becomes possible to further suppress decrease of the light emission output with the increase in the environmental temperature compared to the case where, for example, the final well layer is set as the maximum thickness well layer and the quasi-final well layer is set as the quasi-maximum thickness well layer as in Example 2.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light-emitting element comprising:
   an n-type semiconductor layer that is composed of a group III nitride semiconductor containing an n-type impurity;
   a light emitting layer that is laminated on the n-type semiconductor layer and composed of a group III nitride semiconductor, the light emitting layer emitting light by passing a current; and
   a p-type semiconductor layer that is laminated on the light emitting layer and composed of a group III nitride semiconductor containing a p-type impurity,
   wherein the light emitting layer comprises:

at least four well layers that are composed of a group III nitride semiconductor; and at least five barrier layers that are composed of a group III nitride semiconductor whose band gap is larger than a band gap of the group III nitride semiconductor of the well layers, the barrier layers sandwiching each of the at least four well layers from both sides, being connected to the n-type semiconductor layer at an interface portion with the n-type semiconductor layer and being connected to the p-type semiconductor layer at an interface portion with the p-type semiconductor layer, wherein, the at least four well layers comprise:

a plurality of n-side well layers that are provided in order from a side near the n-type semiconductor layer, each of which is set to have a first thickness and a first composition to output light of a common wavelength; and a plurality of p-side well layers that are provided in order from a side near the p-type semiconductor layer to the plurality of n-side well layers, each of which is set to have a second thickness larger than the first thickness and have a second composition different from the first composition of the plurality of n-side well layers to output light of the common wavelength, wherein, of the at least four well layers, the number of the p-side well layers is two, and the n-side well layers constitute all of the at least four well layers other than the two p-side well layers, wherein the at least five barrier layers comprise:

a plurality of n-side barrier layers that are provided in order from the side near the n-type semiconductor layer, each of the n-side barrier layers having a third thickness; and one p-side barrier layer that is provided nearer to the side of the p-type semiconductor layer than the plurality of n-side barrier layers, the p-side barrier layer having a fourth thickness larger than the third thickness, and wherein the n-side barrier layers constitute all of the at least five barrier layers other than the one p-side barrier layer, wherein each of the at least five barrier layers is composed of GaN and each of the at least four well layers is composed of GaInN, and a density of In in the p-side well layer of the well layer is lower than a density of In in the n-side well layer of the well layer.

2. A light-emitting device comprising:

a base section in which a first wiring and a second wiring are formed; and a semiconductor light emitting element that emits light by passing a current via the first wiring and the second wiring, the semiconductor light emitting element comprising:

an n-type semiconductor layer that is composed of a group III nitride semiconductor containing an n-type impurity;

a light emitting layer that is laminated on the n-type semiconductor layer and composed of a group III nitride semiconductor, the light emitting layer emitting light by passing a current;

a p-type semiconductor layer that is laminated on the light emitting layer and composed of a group III nitride semiconductor containing a p-type impurity;

a p-side electrode for electrically connecting the p-type semiconductor layer and the first wiring; and an n-side electrode for electrically connecting the n-side semiconductor layer and the second wiring, wherein the light emitting layer comprises:

at least four well layers that are composed of a group III nitride semiconductor; and at least five barrier layers that are composed of a group III nitride semiconductor whose band gap is larger than a band gap of the group III nitride semiconductor of the well layers, the barrier layers sandwiching each of the at least four well layers from both sides, being connected to the n-type semiconductor layer at an interface portion with the n-type semiconductor layer and being connected to the p-type semiconductor layer at an interface portion with the p-type semiconductor layer, wherein, the at least four well layers comprise:

a plurality of n-side well layers that are provided in order from a side near the n-type semiconductor layer, each of which is set to have a first thickness and a first composition to output light of a common wavelength; and a plurality of p-side well layers that are provided in order from a side near the p-type semiconductor layer to the plurality of n-side well layers, each of which is set to have a second thickness larger than the first thickness and have a second composition different from the first composition of the plurality of n-side well layers to output light of the common wavelength, wherein, of the at least four well layers, the number of the p-side well layers is two, and the n-side well layers constitute all of the at least four well layers other than the two p-side well layers, wherein the at least five barrier layers comprise:

a plurality of n-side barrier layers that are provided in order from the side near the n-type semiconductor layer, each of the n-side barrier layers having a third thickness; and one p-side barrier layer that is provided nearer to the side of the p-type semiconductor layer than the plurality of n-side barrier layers, the p-side barrier layer having a fourth thickness larger than the third thickness, and wherein the n-side barrier layers constitute all of the at least five barrier layers other than the one p-side barrier layer, wherein each of the at least five barrier layers is composed of GaN and each of the at least four well layers is composed of GaInN, and a density of In in the p-side well layer of the well layer is lower than a density of In in the n-side well layer of the well layer.

* * * * *